United States Patent [19]

Demnianiuk

[11] 4,331,373
[45] May 25, 1982

[54] MODULAR SYSTEM WITH SYSTEM CARRIER, TEST CARRIER AND SYSTEM CONNECTOR

[75] Inventor: Eugene F. Demnianiuk, San Diego, Calif.

[73] Assignee: Burroughs Corporation, Detroit, Mich.

[21] Appl. No.: 133,100

[22] Filed: Mar. 24, 1980

[51] Int. Cl.³ .............................................. H05K 1/02
[52] U.S. Cl. .............................. 339/91 R; 339/17 CF; 339/174
[58] Field of Search ................. 339/17 CF, 174, 91 R, 339/75 M

[56] References Cited

U.S. PATENT DOCUMENTS

| | | | |
|---|---|---|---|
| 3,335,327 | 8/1967 | Damon et al. | 339/17 CF X |
| 3,454,921 | 7/1969 | Coleman et al. | 339/17 CF X |
| 3,722,927 | 3/1973 | Miska | 339/91 R X |
| 3,757,271 | 9/1973 | Judge et al. | 339/17 CF |
| 3,874,768 | 4/1975 | Cutchaw | 339/17 CF |
| 3,954,175 | 5/1976 | Mason | 339/17 CF X |

*Primary Examiner*—Eugene F. Desmond
*Attorney, Agent, or Firm*—Charles J. Fassbender; Kevin R. Peterson

[57] ABSTRACT

Disclosed is a modular system including a systems carrier, a test carrier and a systems connector for protecting an integrated circuit package during handling, testing, transportation and use. The system carrier comprises a frame with a large center opening to receive the package body and grooves to receive the package leads, and a bracket positionable on the frame to secure the package within the frame. This system carrier and the integrated circuit package become one unit which fits within the test carrier whose outside dimensions are determined by the testing machine in which the test carrier is positioned. The system carrier with its integrated circuit package also fits into the system connector which has leads for connecting the package leads to other conductors such as on a printed circuit board in an electronic system. The system connector also has means for retaining the system carrier and its package within the system connector and for maintaining electrical contact between the package and the remainder of the system.

6 Claims, 15 Drawing Figures

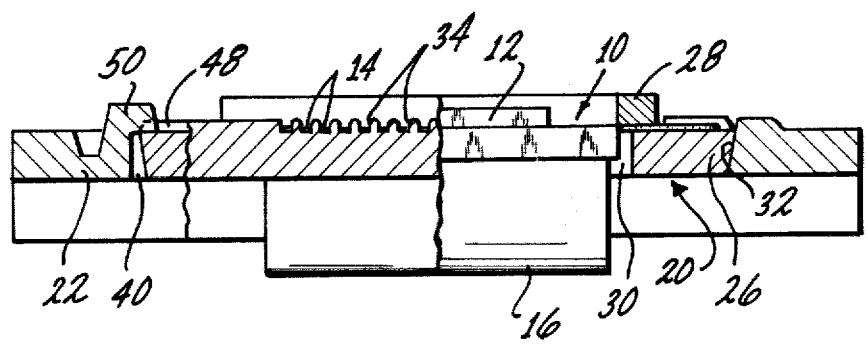
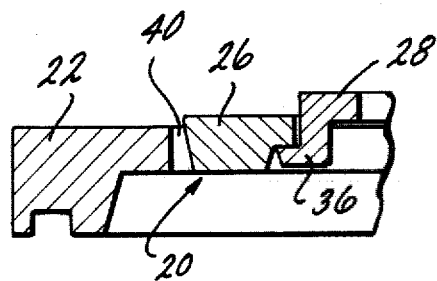
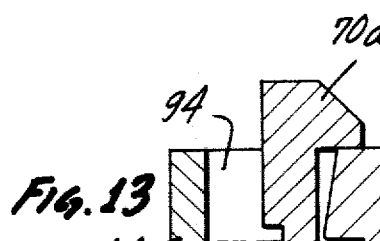
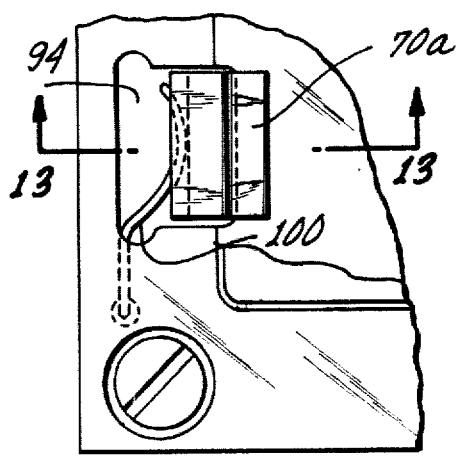

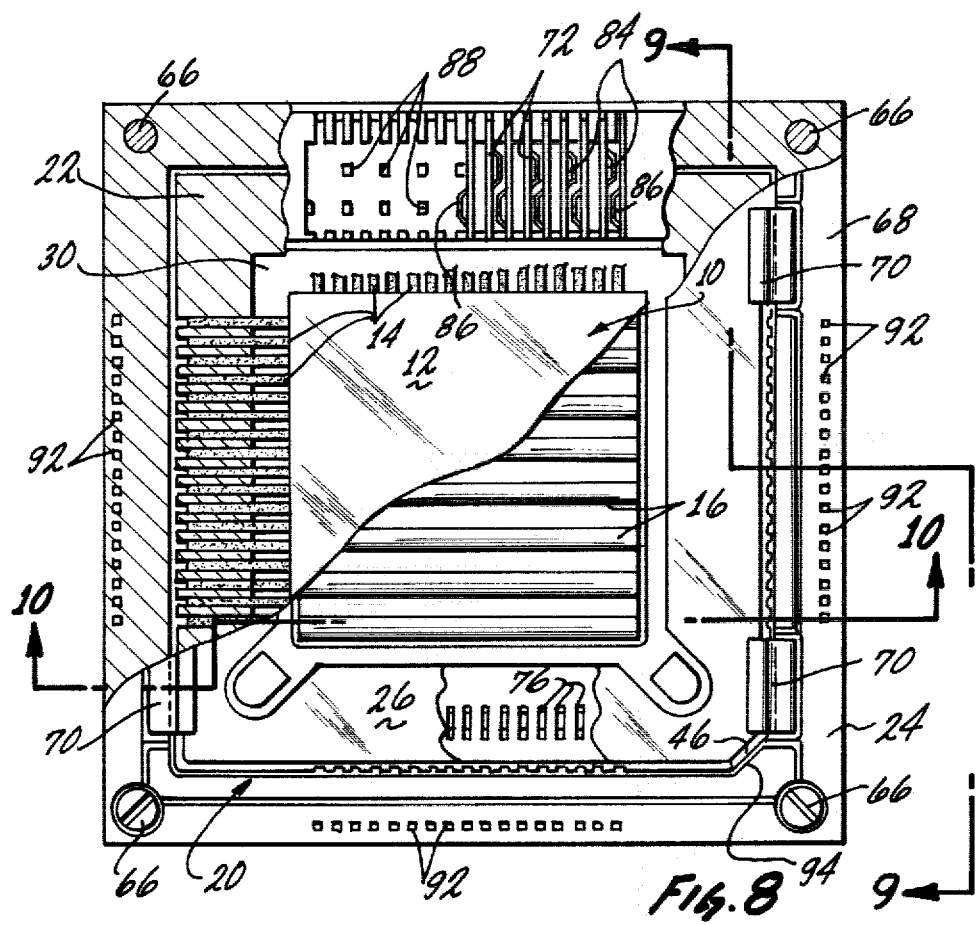
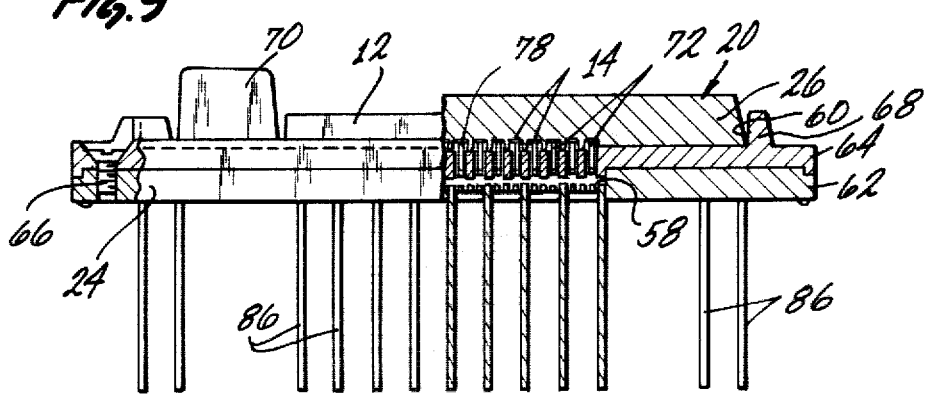

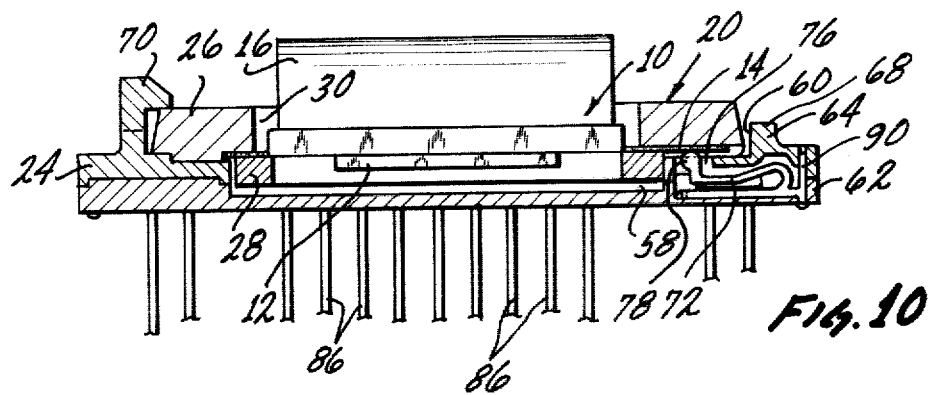
Fig. 10
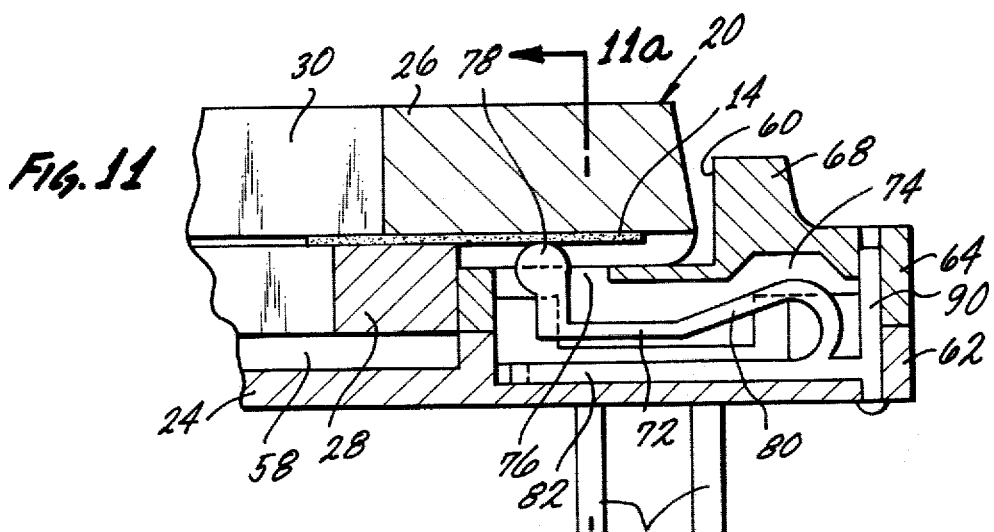
Fig. 11
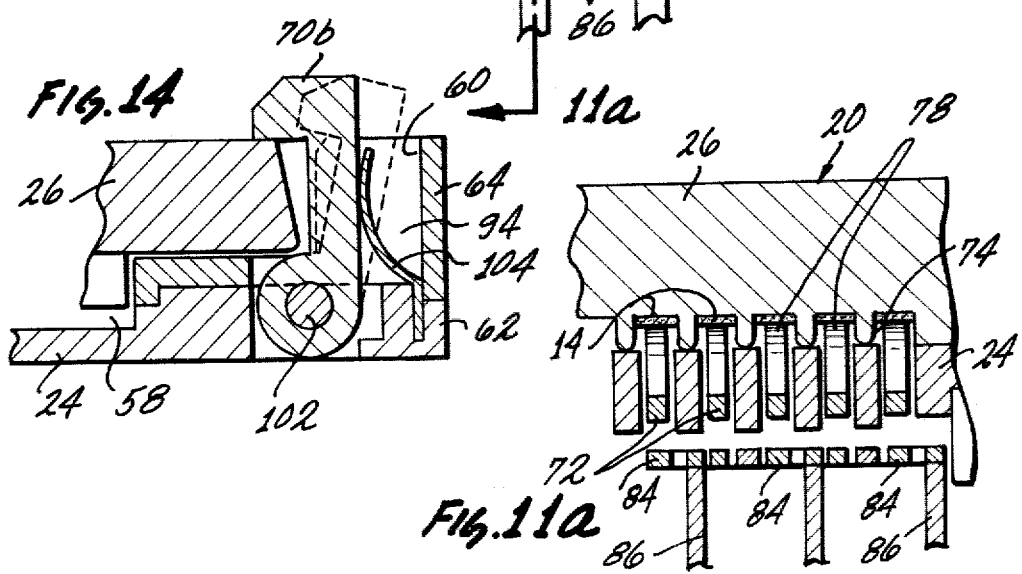
Fig. 14
Fig. 11a

MODULAR SYSTEM WITH SYSTEM CARRIER, TEST CARRIER AND SYSTEM CONNECTOR

BACKGROUND OF THE INVENTION

After the fabrication of integrated circuit packages, the packages are usually tested for functionality, electrical continuity, etc., by placing the leads of the package into a test carrier and then into a testing device. The outside dimensions of these test carriers are standardized to fit the test machine and the internal package receiving configuration and dimensions accommodate the size of the package under test. Accordingly, it is common to provide a number of test carriers of the same external dimension for use in the testing machine but with an internal size to accommodate the size of the package under test.

If the package under test meets the criteria required of it, the package is then placed into an electronic system in which the integrated circuit is to operate; usually the system for which the integrated circuit was designed. To connect the package into the system, the tested package is usually placed in a system connector which is attached electrically in several ways to other conductors in the system for the operation of the package in the system.

With the continued development of integrated circuit packages and the increase in the number of leads, and for other reasons, the handling of the packages, their transportation, their insertion into the testing machine and into the system in which the package is to be used, has been difficult without disturbing the layout of the leads, as by bending, or without damaging. If such a disturbance or damage does occur, insertion of the package into the test carrier and/or the system connector is tedious to say the least. One has to straighten out the leads, either manually, or by still another machine, and during this process, sometimes one or more of the leads are broken, rendering the package almost useless.

Accordingly, it is an object of this invention to provide a system which eliminates the difficulties of the prior art and provides a means for protecting the integrated circuit package and its leads during handling, testing, transportation, and insertion into an electronic system.

SUMMARY OF THE INVENTION

The invention which attains the foregoing object of protecting the integrated circuit package comprises a modular system including a systems carrier, a test carrier and a systems connector. The systems carrier comprises a carrier frame with a large center opening and upwardly opening grooves to receive the package leads, when a package is inserted within the opening, and a bracket positionable on the frame and package to fasten the bracket to the frame thereby securing the package within the frame. This system carrier becomes a part of the package and fits within the test carrier whose outside dimensions are determined by the testing machine in which the test connector is located. The system carrier also fits into the system connector which forms part of an electronic system and which has leads for connecting the leads of the package to other conductors such as on a printed circuit board when the integrated circuit package and its carrier is inserted within the system connector. The system connector also has means for retaining the system carrier and its package within the system connector and maintaining electrical contact between the package and the remainder of the system. A plurality of embodiments of the retaining means is disclosed.

BRIEF DESCRIPTION OF THE DRAWINGS

FIGS. 5, 6, and 7 are views taken along lines 5—5, 6—6, and 7—7, respectively, of FIG. 4 to show the details of the means for connecting the systems carrier and its package in the test carrier, FIG. 8 is a plan view of the systems carrier and its package in the system connector and partially broken away to show the details of both, FIGS. 9 and 10 are cross-sectional views taken along lines 9—9 and 10—10, respectively, of FIG. 8 to show the details thereof, FIG. 11 is an enlarged cross-sectional view of a portion of the systems carrier and its package and the connection of the package leads to the systems connector contact leads, FIG. 11a is a view of FIG. 11 taken along lines 11a—11a of FIG. 11 looking in the direction of the arrow (see also FIG. 9 for the portion of the systems connector displayed in FIG. 11a), FIGS. 12-14 are alternative embodiments of the means for attaching the systems carrier and its package to the systems connector, with FIG. 13 being a cross-sectional view taken along line 13—13 of FIG. 12 and FIG. 14 being a view similar to FIG. 13.

DETAILED DESCRIPTION OF THE PREFERRED EMBODIMENTS

Figure 1:
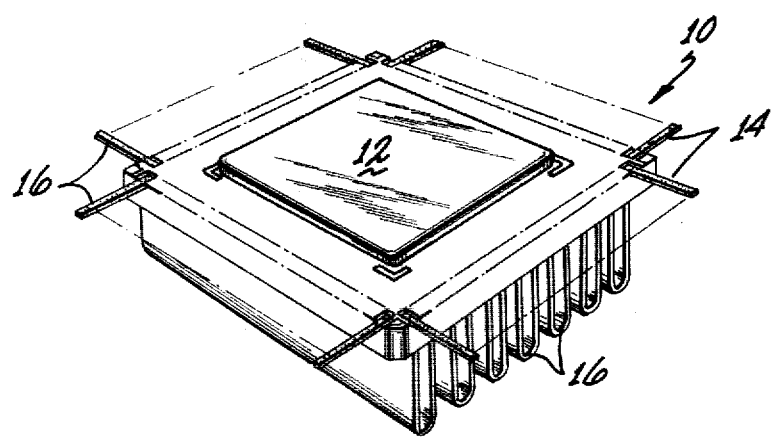
FIG. 1 is a perspective view of a package.
Figure 2:
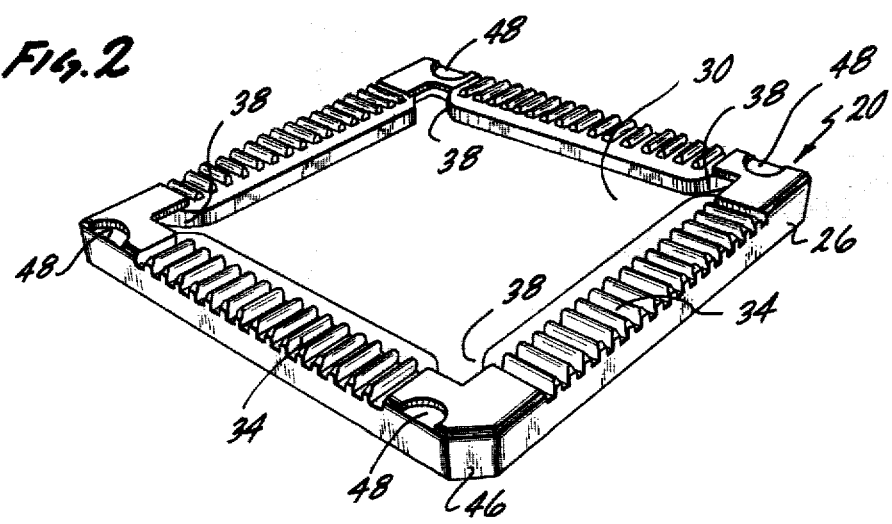
FIG. 2 is a perspective view of the frame of the systems carrier.
Figure 3:
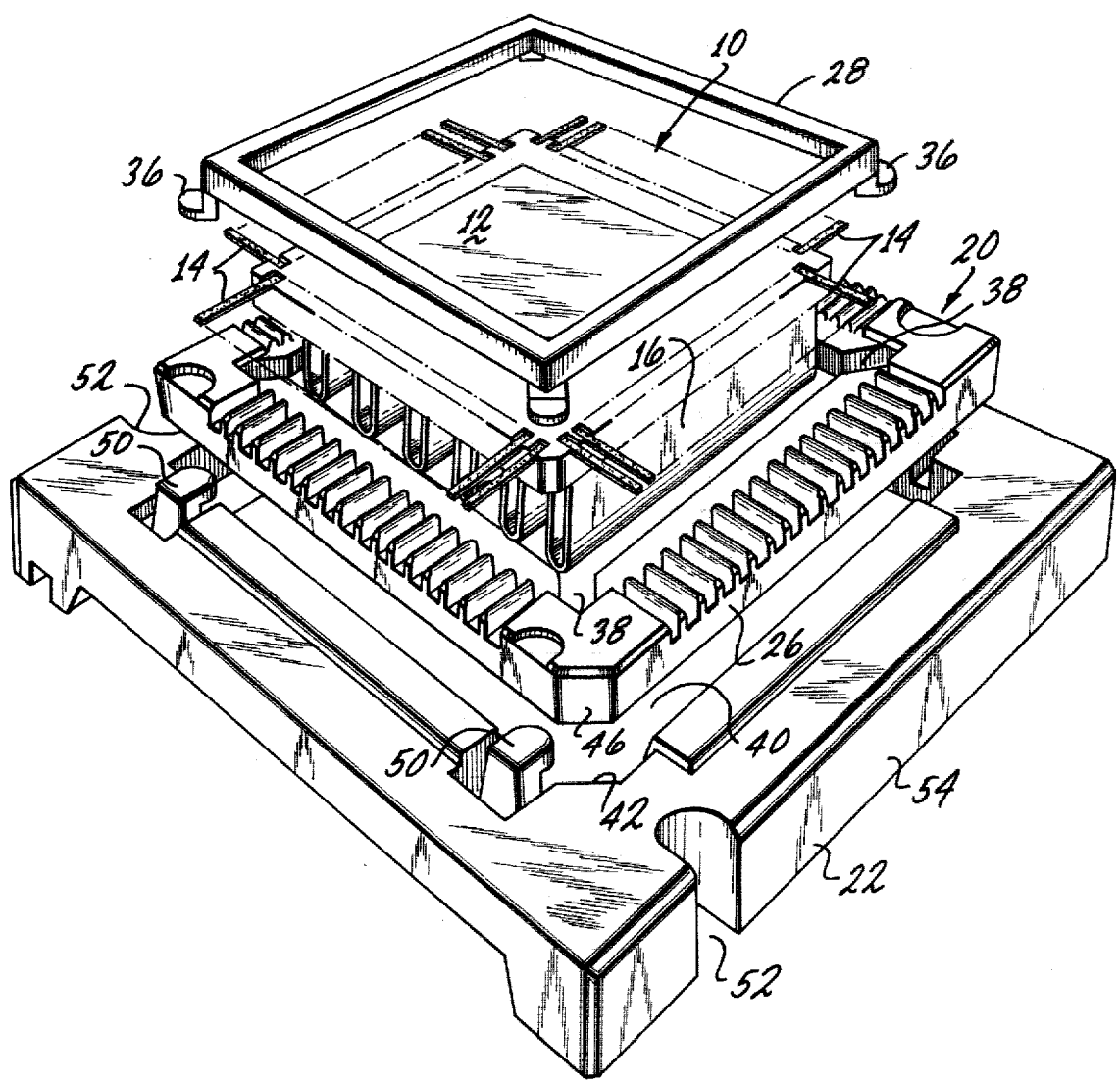
FIG. 3 is an exploded view, in perspective, to show the package before it is encased in the systems carrier and before being inserted into the test carrier.
Figure 4:
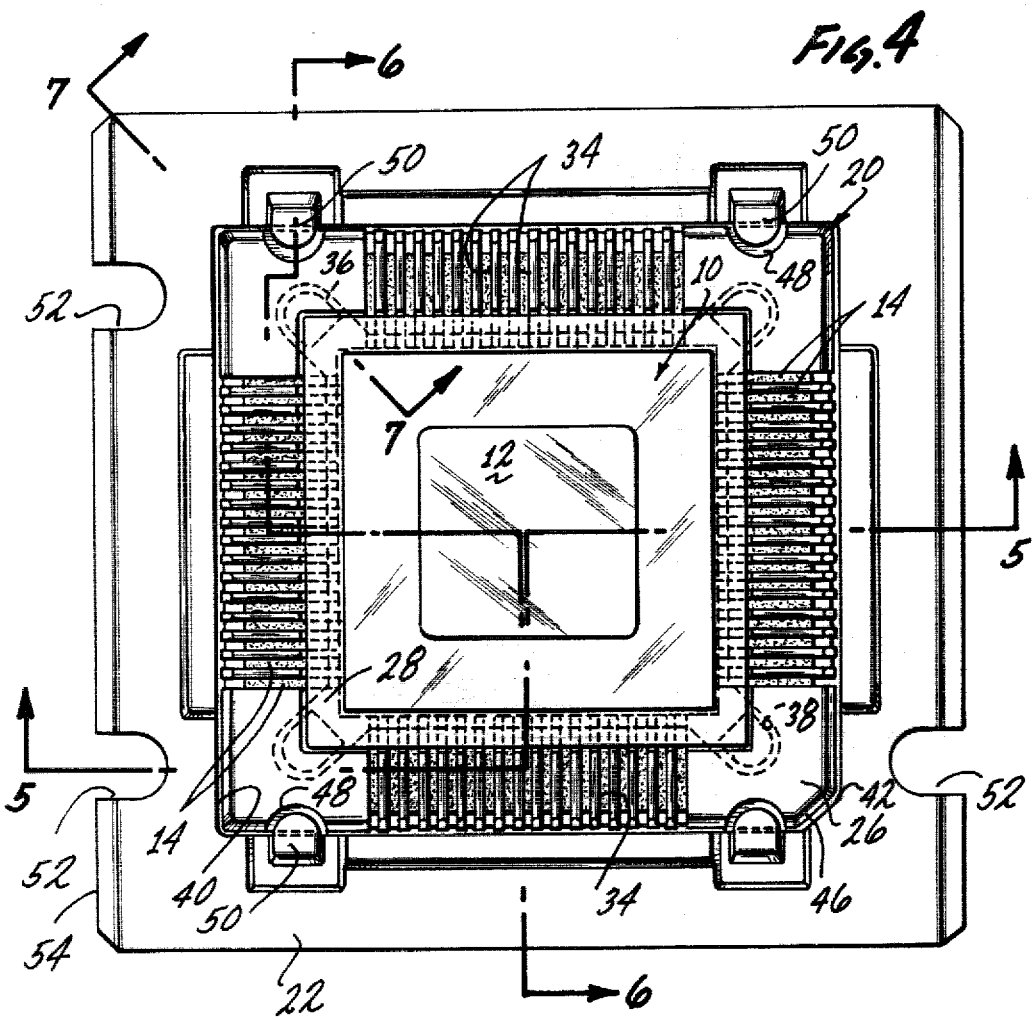
FIG. 4 is a plan view of the systems carrier and its package in the test carrier.
Figure 5:
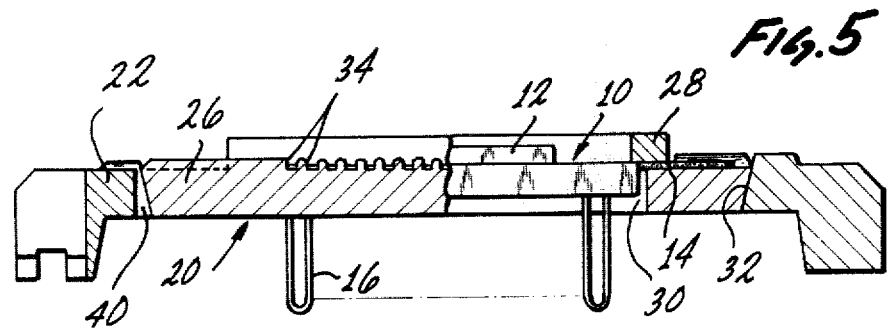

Turning now to FIGS. 1-7 of the drawings there is shown an integrated circuit package 10 which is square in configuration and is provided on one side with a cover 12 for the chip (not shown) which is connected to the outwardly extending leads 14. Also, a suitable heat sink 16 is provided and in the embodiment shown the heat sink is a convolution of metal or bellows extending from the package opposite from the cover.

For the reasons stated above, to protect the package leads for testing, handling and the like, there is provided a modular system which includes a systems carrier 20 with its package, a test carrier 22 and a systems connector 24. (FIG. 8 et seq.).

The systems carrier 20 includes a carrier frame 26 and a bracket 28 of a suitable plastic material, both of which are square, since the package is square, with a large center opening 30 defined by the walls of the frame. These walls are tapered to fit similarly tapered walls on the test carrier as at 32 in FIG. 5. The center opening is large enough to receive the body of the package with the leads 14 extending outwardly to be received in upwardly opening grooves 34, one for each of the leads located on the top of the carrier frame 26. The length of the grooves 34 and the width of the carrier are selected according to the length of the leads 14. The carrier frame 26 is of a thickness to accommodate the body of the package and allow heat sink 16 to extend beyond the depth of the frame. To fasten the package onto the carrier frame, the bracket 28 in the form of a frame is positionable on top of the frame and on the integrated circuit package with means to fasten the bracket to the frame (FIGS. 3 and 7) thereby securing the integrated circuit package in the frame and forming the systems carrier. In this embodiment the bracket is provided with four downwardly extending retaining tabs 36 which are insertable in four corner recesses 38 and which through the interaction of the two plastic materials form the means for holding the carrier and the package as one unit which may be inserted, as such, into the test carrier 22 and into a system connector 24 thereby protecting the leads of the package against damage.

The test carrier 22, in the embodiment shown, is also a square frame of a suitable plastic material with tapered inner side walls defining a large center opening 40 to receive the system carrier 20 therein. Suitable indexing means in the form of a slanted carrier wall 42 mates with a chamfered shoulder 46 on the systems carrier to prevent improper insertion of the systems carrier into the test carrier. The systems carrier is also provided with grooves 48 (four shown) on its top which are engaged by resilient tabs 50 located on four corners of the test carrier to hold and retain the system carrier and its package securely within test carrier. The functionality of the tabs is due to the plastic material used in the manufacture of the test carrier. This test carrier has an outside dimension which is standardized and determined by the test machine manufacturer and is also provided with an indexing means in the form of grooves 52 on its outside walls 54 to polarize the connector and prevent improper insertion of the connector in the test machine. The manner of connecting the test machine to the package leads and the manner of testing the package is not disclosed since they are not part of this invention, suffice to say that typically the package is tested for functionality, electrical continuity, etc., while in the test machine and it is to be noted that this is accomplished without removal of the package from the systems carrier.

If the package under test meets the desired criteria, the systems carrier is removed from the test carrier by simply pulling back on the tabs 50 and removing the system carrier. This system carrier with its package is then ready for insertion into the systems connector 24 which will now be described in detail.

On the other hand, if the package does not meet the test criteria, the package can be removed from the system carrier by simply pulling back on the tabs 36 and pulling the bracket apart from the frame.

Referring to FIGS. 6–12, the systems connector 24, like the test carrier 22, also has a central opening of a size to receive the system carrier and its successfully tested package. However, in this case, the opening is closed on the bottom and is actually a two layer opening with a lower, smaller portion 58 located inwardly of the outer, larger portion 60. The purpose of this two layer concept is to accommodate the smaller body of the package while allowing the frame 26 of the systems carrier to be inserted within the larger portion 60 in the systems connector.

In this embodiment, the systems carrier and package are inserted in the central opening upside down as compared to its placement in the test carrier 22, that is, the heat sink 16 extends upwardly for air cooling purposes. Also in the embodiment illustrated, the connector is actually of two pieces, one, a relatively thin flat piece 62 having a bottom side adapted to be positioned adjacent a printed circuit board or the like and, two, a top piece 64 positioned on the flat piece 62. Both pieces 62 and 64 are fastened together by screws 66 located at the corners of the piece. The upper piece 64 has an upwardly extending ledge 68 which defines the central opening. The top piece 64 is provided with integral resilient upwardly extending tabs 70 which also extend into the cavity and engage the bottom (top as shown in this Figure) of the systems carrier so that the package 14 leads engage contacts (conductors) 72 in the systems connector.

To accommodate the contacts 72, both the bottom and top pieces 64 and 66 define elongated cavities 74 on the four sides of the connector. The top piece 64 also is provided with relatively thin slots 76 (FIGS. 8 and 11), one for each lead, allowing one end 78 of the contacts to protrude therethrough to engage the leads 14 of the package. These contacts 72 have a curved arm 80 extending from a flat horizontal base arm 82 with an offset portion 84 from which connector leads 86 protrude through openings 88 in the bottom piece 62 so as to be connected to other conductors in the system thus making electrical connection between the package and the remainder of the system. Certain of the offset portions 84 on the base arms 82 are located relative to other offset portions to allow the contacts to be brought closer together by staggering the offset portions in the cavities 74 and also staggering the connector leads 86. The curved contact arms 80 are spring biased outwardly toward the package leads 14 to provide the resilient contact with the package leads with the carrier frame together with the tabs 70 forming the means of forcing the leads into engagement with the contact ends 78. These contacts are also provided with third arms 90 which extend from the base arms 82 out through openings 92 which are used as test probe contacts for testing the individual leads of the package which are otherwise covered by the carrier frame. These probe contacts permit the package leads to be tested without removal of the carrier frame from the systems connector.

Again, like the test carrier 22, the systems connector 24 is provided with a small slanted wall 94 in one corner of the opening to accommodate the chamfered corner 46 of the carrier frame to prevent an incorrect insertion of the system carrier and its package into the systems connector.

In the embodiment of the systems connector above described, the retaining tabs 70 are shown as an integral part of the top piece 64 of the system connector and rely on the type of material used in making the systems connector for their functionality. However, FIGS. 10–12 show alternative spring loaded retaining tabs which may be used with the systems connector. In these Figures, these elements of the connector having the same function as in the prior description will be given like reference numerals for simplicity. Also, where the elements have the same function but are of a different configuration, a suffix a and b will be used. For these embodiments, four additional rectangular cavities 94 are provided in the flat piece 62 and top piece 64 which open up on the top edge of the connector in which the retaining tabs 70a and 70b are inserted. In the embodiment of FIGS. 10 and 11, the top and bottom pieces 62 and 64 are further formed to provide a slot 96 for each tab 70a since the latter is provided with an additional leg 98 which slides in the slot 96 when the tab 70a moves inward or outward. Inward and outward movement relative to the center of the connector in order for the tab to engage and retain the systems carrier is provided by a curved spring member 100 for each tab which biases the tab 70a towards the connector's center.

In the next embodiment, FIG. 14, the upper and lower pieces are provided with somewhat similar cavities 94 except that the tab 70b is pivotally attached within the cavity at 102 and spring biased by a spring 104 towards the center of the connector. In both embodiments, the top of the systems carrier is engaged by the tabs 70a or 70b, as the case may be, and the systems carrier and its package are withdrawn from the systems connector by simply moving the tabs 70a and 70b outwardly against their respective spring bias. Otherwise, the function of the connector of these embodiments is the same as in the above described embodiment.

What is claimed is:

1. A modular system for use with an integrated circuit flat-package having a body with four orthogonal sides and substantially straight leads extending laterally from said four sides of said body, said modular system comprising:
    a carrier frame having four orthogonal sides defining a hole for receiving said body of said flat-package, said four sides having grooves extending outwardly from said hole for receiving said leads;
    means for attaching said flat-package to said carrier frame, with said body being in said carrier frame hole and said substantially straight leads being in said grooves to prevent damage to said leads during handling;
    a system connector having four orthogonal sides for overlying a printed circuit board surface, said system connector sides defining a hole that also overlies said printed circuit board surface for receiving said carrier frame with said flat-package attached thereto;
    electrical conductors in said system connector for rigid attachment to said printed circuit board surface and aligned in said four system connector sides with said leads in said carrier frame grooves;
    said system connector including tab means for engaging said carrier frame to replaceably secure said carrier frame and attached flat-package in said hole of said system connector with said electrical conductors in contact with said leads.

2. The system as claimed in claim 1 and further including a test carrier having a large center opening for receiving said carrier frame with its integrated circuit package attached thereto, and
    means for engaging said carrier frame for holding said integrated circuit package in the test carrier while exposing said leads in said grooves,
    the outer dimension of said test carrier being adapted to fit a test machine on which the test carrier is positioned and which makes electrical contact to said exposed leads in said grooves.

3. The system as claimed in claim 2, wherein said system connector further includes contacts extending through a plurality of openings in said system connector to provide test probe points for each package lead.

4. The system as claimed in claim 1, wherein said tab means is integral with said system connector.

5. The system as claimed in claim 1, wherein said tab means is slidably connected in said systems connector and resiliently biased toward said hole in said system connector.

6. The system as claimed in claim 1, wherein said tab means is pivotally connected to said system connector and resiliently biased toward said hole in said system connector.

* * * * *